(12) United States Patent
Mori et al.

(10) Patent No.: US 6,661,248 B2
(45) Date of Patent: Dec. 9, 2003

(54) TESTER FOR SEMICONDUCTOR INTEGRATED CIRCUITS

(75) Inventors: Hisaya Mori, Hyogo (JP); Shinji Yamada, Hyogo (JP); Teruhiko Funakura, Tokyo (JP); Hisayoshi Hanai, Tokyo (JP)

(73) Assignees: Mitsubishi Denki Kabushiki Kaisha, Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 0 days.

(21) Appl. No.: 10/145,192

(22) Filed: May 15, 2002

(65) Prior Publication Data
US 2003/0048112 A1 Mar. 13, 2003

(30) Foreign Application Priority Data
Aug. 31, 2001 (JP) .......................... 2001-264641

(51) Int. Cl.7 .............................................. G01R 31/26
(52) U.S. Cl. ..................... 324/765; 324/158.1
(58) Field of Search ..................... 324/765, 755, 324/158.1; 326/16; 714/718, 763; 365/201, 189.1; 340/146.1, 514

(56) References Cited

U.S. PATENT DOCUMENTS

| | | | | |
|---|---|---|---|---|
| 4,467,275 A | * | 8/1984 | Maeda et al. | 324/713 |
| 5,999,008 A | * | 12/1999 | Currin et al. | 324/765 |
| 6,255,842 B1 | * | 7/2001 | Hashimoto | 324/765 |

FOREIGN PATENT DOCUMENTS

| | | |
|---|---|---|
| JP | 7-128405 | 5/1995 |
| JP | HEI 1-316024 | 12/1998 |
| JP | 2000-356724 | 11/2000 |
| JP | 2002-162450 | 7/2002 |
| TW | 340973 | 9/1998 |

* cited by examiner

Primary Examiner—Kamand Cuneo
Assistant Examiner—Tung X. Nguyen
(74) Attorney, Agent, or Firm—McDermott, Will & Emery

(57) ABSTRACT

A test-assisting device (BOST device) is provided in the vicinity of a testing circuit board that transmits signals to and receive signals from a semiconductor integrated circuit to be tested, and the D/A converter circuit for testing, the A/D converter circuit for testing, the measured-data memory, and the analyzing portion of the test-assisting device are carried by separate circuit boards.

17 Claims, 14 Drawing Sheets

TESTER FOR SEMICONDUCTOR INTEGRATED CIRCUITS

BACKGROUND OF THE INVENTION

1. Field of the Invention

The present invention relates to a tester for semiconductor integrated circuits, and more specifically to a tester for testing semiconductor integrated circuits comprising an A/D converter circuit to convert analog signals to digital signals, and a D/A converter circuit to convert digital signals to analog signals.

2. Background Art

The tester for semiconductor integrated circuit is called simply a tester. In recent years, in a system LSI constituted as a one-chip semiconductor integrated circuit constituted by a plurality of functionally systematized modules (1-chip LSI) or a hybrid integrated circuit in which chips of a plurality of circuits are combined (chip-set LSI), integration by combining high-performance, high-accuracy digital circuits and analog circuits (mixed-signalization) is being progressed rapidly, the testers for these semiconductor integrated circuits to cope with this mixed-signalization is also being progressed rapidly, and testers for testing mixed signal semiconductor integrated circuits are provided from tester manufacturers.

However, in order to accommodate the high-performance specifications of the mixed signal semiconductor integrated circuits, the testers tend to be expensive. Under such a situation, there has been a movement to avoid increase in the cost of tester through the reuse of existing low-speed, low-accuracy testers used, for example, for logic LSIs.

A significant problem to be solved in such testers is the test of D/A converter circuits to convert digital signals to analog signals and A/D converters to convert analog signals to digital signals. With increase in accuracy of these converter circuits, the problem is how to realize testers for semiconductor integrated circuits comprising these converter circuits at low cost.

In a general test circumstance for testers, along a measurement path from the measuring instrument inside the tester to the semiconductor integrated circuit to be tested (hereafter called DUT), there are a plurality of jigs to connect between the tester and the DUT such as a probe card, a test circuit board such as a DUT board and cables, and the measurement path is long, causing noise to occur and measurement accuracy to be reduced, and it is difficult to test of plurality of the DUT at a time. Also, since a low-speed tester cannot test the DUT at a practical speed due to the restriction, increase in testing time for testing mass-produced DUTs is concerned.

Japanese Patent Laid-Open No. 1-316024 proposes a tester comprising a memory element for storing converted data in the address specified by input data to the D/A converter of the testing circuit, in which D/A converted analog signals are inputted to the A/D converter, the outputs of the A/D converter are sequentially stored in the memory element, the converted data stored in the memory element are sequentially transmitted to the tester when all the inputted data have been converted, and the inputted data are sequentially compared with the converted data in the tester.

However, since the inputted data to the D/A converter, the addresses of the memory element for storing converted data, and the control signals must be supplied from the tester, and furthermore, since the data stored in the memory element must be supplied to the tester, the measurement accuracy may be lowered due to noise in the long measurement path between the DUT and the tester. Also due to the occupation of the number of tester pin electronics, the simultaneous measurement of more than one DUT is difficult. Furthermore, since communication to transmit converted data to the tester takes much time, and the test results are judged after all the tests have been completed, the reduction of time is also difficult.

Although the inventors of the present application filed the invention enabling the above-described problems to be solved on Nov. 22, 2000, as Japanese Patent Application No. 2000-356724, the test assisting device known as BOST was still large in the invention of the prior application, and further improvement was required so as to be installed in the space in the vicinity of the testing circuit board.

SUMMARY OF THE INVENTION

The present invention proposes a tester for semiconductor integrated circuits that can realize high-speed, high-accuracy measurement at low costs using a test assisting device that can be installed in a smaller space.

The present invention also proposes a method for testing semiconductor integrated circuits that can realize high-speed, high-accuracy measurement at low costs using a test assisting device that can be installed in a smaller space.

According to one aspect of the present invention, a tester for semiconductor integrated circuits comprises a testing circuit board configured to transmit signals to and receive signals from a semiconductor integrated circuit to be tested, a test assisting device disposed in the vicinity of and connected to the testing circuit board; and a test machine connected to the test assisting device. The semiconductor integrated circuit to be tested comprises an A/D converter circuit to convert analog signals to digital signals, and a D/A converter circuit to convert digital signals to analog signals. The test assisting device has a data circuit, a testing D/A converter circuit, a testing A/D converter circuit, a measured data memory, and an analyzer portion. The data circuit generates digital test signals and supplies the test signals to the D/A converter circuit of the semiconductor integrated circuit to be tested. The testing D/A converter circuit converts digital test signals from the data circuit to analog test signals and supplies the test signals to the A/D converter circuit of the semiconductor integrated circuit to be tested. The testing A/D converter circuit converts analog test outputs of the D/A converter circuit of the semiconductor integrated circuit to be tested to digital test outputs. The measured data memory stores the digital test outputs from the A/D converter circuit of the semiconductor integrated circuit to be tested and the digital test outputs of the testing A/D converter circuit. The analyzer portion analyzes each of the digital test outputs stored in the measured data memory. These data circuit, testing D/A converter circuit, testing A/D converter circuit, measured data memory, and analyzer portion are constituted so as to be separately provided on a plurality of circuit boards. The tester for semiconductor integrated circuits is constituted so as to supply the test signals containing the digital test signals and the analog test signals to the semiconductor integrated circuit to be tested based on instructions from the test machine. The tester supplies the results of analysis of each digital test output stored in the measured data memory by the analyzer portion to the test machine.

According to another aspect of the present invention, a tester for semiconductor integrated circuits comprises a testing circuit board configured to transmit signals to and receive signals from a semiconductor integrated circuit to be tested, a test assisting device disposed in the vicinity of and connected to the testing circuit board; and a test machine connected to the test assisting device. The semiconductor integrated circuit to be tested comprises an A/D converter circuit to convert analog signals to digital signals, and a D/A converter circuit to convert digital signals to analog signals. The test assisting device has a data circuit, a testing D/A converter circuit, a testing A/D converter circuit, a measured data memory, an analyzer portion, a first circuit board, a second circuit board, and a third circuit board. The data circuit generates digital test signals and supplies the test signals to the D/A converter circuit of the semiconductor integrated circuit to be tested. The testing D/A converter circuit converts digital test signals from the data circuit to analog test signals and supplies the test signals to the A/D converter circuit of the semiconductor integrated circuit to be tested. The testing A/D converter circuit converts analog test outputs of the D/A converter circuit of the semiconductor integrated circuit to be tested to digital test outputs. The measured data memory stores the digital test outputs from the A/D converter circuit of the semiconductor integrated circuit to be tested and the digital test outputs of the testing A/D converter circuit. The analyzer portion analyzes each of the digital test outputs stored in the measured data memory. The first circuit board carries at least the testing D/A converter circuit and the testing A/D converter circuit. The second circuit board carries at least the measured data memory. The third circuit board carries the analyzer portion. The tester for semiconductor integrated circuits is constituted so as to supply the test signals containing the digital test signals and the analog test signals to the semiconductor integrated circuit to be tested based on instructions from the test machine. The tester supplies the results of analysis of each digital test output stored in the measured data memory by the analyzer portion to the test machine.

According to another aspect of the present invention, there is provided a method for testing a semiconductor integrated circuit to be tested. The semiconductor integrated circuit comprises an A/D converter circuit to convert analog signals to digital signals, and a D/A converter circuit to convert digital signals to analog signals. The method uses a test assisting device disposed in the vicinity of a testing circuit board to transmit signals to and receive signals from a semiconductor integrated circuit to be tested. The test assisting device has a data circuit, a testing D/A converter circuit, a testing A/D converter circuit, a measured data memory, and an analyzer portion. The data circuit generates digital test signals and supplies the test signals to the D/A converter circuit of the semiconductor integrated circuit to be tested. The testing D/A converter circuit converts digital test signals from the data circuit to analog test signals and supplies the test signals to the A/D converter circuit of the semiconductor integrated circuit to be tested. The testing A/D converter circuit converts analog test outputs of the D/A converter circuit of the semiconductor integrated circuit to be tested to digital test outputs. The measured data memory stores the digital test outputs from the A/D converter circuit of the semiconductor integrated circuit to be tested and the digital test outputs of the testing A/D converter circuit. The analyzer portion analyzes each of the digital test outputs stored in the measured data memory. These data circuit, testing D/A converter circuit, testing A/D converter circuit, measured data memory, and analyzer portion are constituted so as to be separately provided on a plurality of circuit boards. The method supplies the test signals containing the digital test signals and the analog test signals to the semiconductor integrated circuit to be tested based on instructions from the test machine. The method supplies the results of analysis of each digital test output stored in the measured data memory by the analyzer portion to the test machine.

A tester of a semiconductor integrated circuit according to the present invention, as described above, since the test assisting device disposed in the vicinity of the testing circuit board is provided with a data circuit, a testing D/A converter circuit, a testing A/D converter circuit, a measured data memory, and a DSP analyzing portion; the test assisting device is made to conduct the A/D converter circuit and the D/A converter circuit of a semiconductor integrated circuit to be tested; and in addition, the test assisting device is constituted separately on a plurality of circuit boards; the test of a mixed-signal-type semiconductor integrated circuit comprising an A/D converter circuit and a D/A converter circuit can be conducted at high accuracy and high speed, and the cost reduction of the tester can be achieved, the test assisting device can be installed in a small space, and the space for testing is saved.

Also according to the tester using a first circuit board carrying at least a D/A converter circuit for testing and an A/D converter circuit for testing, a second circuit board carrying at least a measured data memory, and a third circuit board carrying at least a analyzing portion, the test at high accuracy and high speed can be conducted, and the price can be reduced. In addition, since the test assisting device is divided on at least three circuit boards, the test assisting device can be installed in a small space, and the space can be saved.

Other and further objects, features and advantages of the invention will appear more fully from the following description.

DETAILED DESCRIPTION OF THE PREFERRED EMBODIMENTS

First Embodiment

Figure 1B:
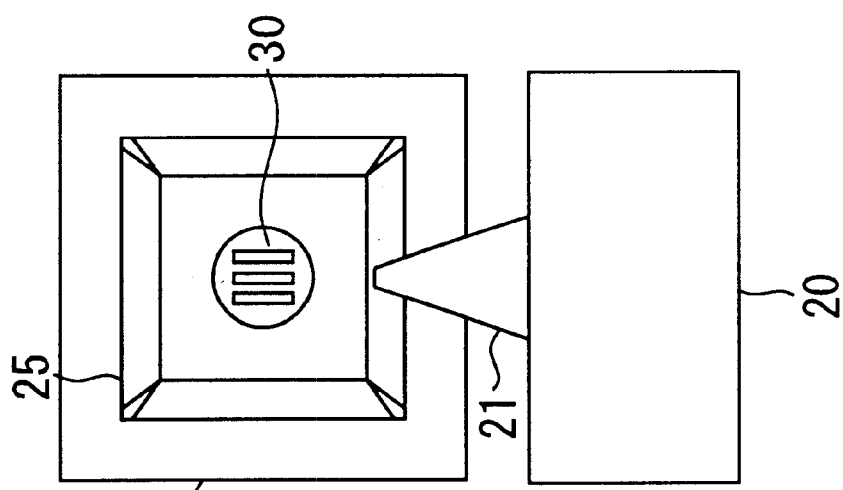
FIGS. 1A and 1B are diagrams to show the configuration of First Embodiment of a tester for semiconductor integrated circuits according to the present invention.
Figure 1A:
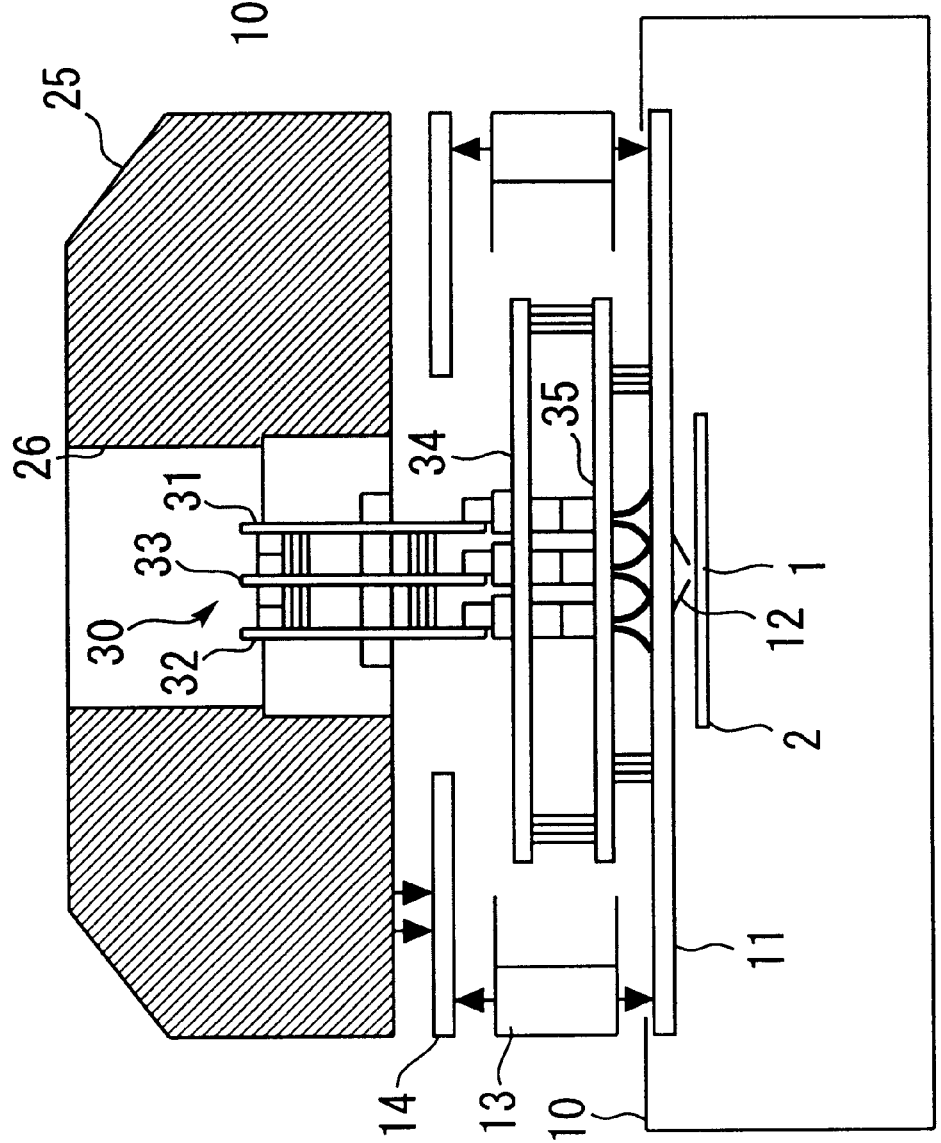

FIG. 1 is a diagram to show the configuration of First Embodiment of a tester for semiconductor integrated circuits according to the present invention. FIG. 1A is a side view of the major portion of First Embodiment, and FIG. 1B is a top view of First Embodiment including the test machine (main body).

The tester of First Embodiment is a tester used when a semiconductor integrated circuit to be tested (DUT) 1 is contained in an LSI chip or a semiconductor wafer 2, that is, in the preliminary process for manufacturing a semiconductor integrated circuit. This tester comprises a probing device (prober) 10, a test machine (Main body of LSI tester) 20, a testing head portion 25, and a test-assisting device (BOST device) 30. The BOST device 30 is an external self-diagnosing device, and BOST is the abbreviation of Built-Off-Self-Test.

First, the DUT 1 is a system LSI, which is constituted by a large number of logic circuits, memory circuits, a plurality of A/D converting circuits, and a plurality of D/A converting circuits. Each A/D converting circuit converts analog signals to digital signals, and each D/A converting circuit converts digital signals to analog signals. This type of DUT 1 is known as a mixed signal-type LSI, which processes both signals of analog and digital signals. As the DUT 1, a mixed signal-type hybrid integrated circuit (hybrid IC), in which a plurality of chips are integrated on a common circuit board, can be used.

The probing device (probe) 10 has a testing circuit board 11, and in First Embodiment, the testing circuit board 11 is constituted as a probe card, and a large number of probe needles 12 are provided in the center portion of the lower surface thereof. The probe needles 12 are disposed so as to contact the LSI chip or semiconductor wafer 2, and supply predetermined voltage, current, or signals to the predetermined portions of the DUT 1, and take out predetermined voltage, current, or signals from the other predetermined portions of the DUT 1.

The testing head portion 25 of the test machine 20 is connected to the test machine 20 through a cable 21, supplies the source voltage, clock signals, control signals, and test signals from the test machine 20 to the DUT 1, and supplies the source voltage, test instruction signals such as test number code, and BOST control signals from the test machine 20 to the BOST device 30. The testing head portion 25 is formed, for example, in a square pillar shape, and a circular scope hole 26 passing through the testing head portion 25 is formed in the center portion thereof. The scope hole 26 has a diameter of, for example, 120 to 130 mm. On the probing device 10 is disposed an annular pogo ring 13, on which is further disposed an annular attachment board 14, and the testing head portion 25 is disposed on the attachment board 14. The voltage and signals from the testing head portion 25 are supplied to the testing circuit board 11 through the attachment board 14 and the pogo ring 13, and supplied to the DUT 1 and the BOST device 30 from the testing circuit board 11.

The BOST device 30 is disposed on the testing circuit board 11. The BOST device 30 is composed of five circuit boards 31, 32, 33, 34, and 35. The circuit boards 31, 32, and 33 are disposed in parallel to each other, and perpendicularly to the testing circuit board 11; and the remaining circuit boards 34 and 35 are disposed in parallel to the testing circuit board 11 so as to overlap each other. The circuit boards 34 and 35 are interface substrates. The interface substrate 35 is disposed immediately above the testing circuit board 11 leaving a space, and the interface substrate 34 is disposed above the interface substrate 35 leaving a space. The circuit boards 31, 32, and 33 are disposed above the interface substrate 34 leaving spaces from each other.

The circuit boards 34 and 35 are disposed in the internal space of the inner circumference of the annular pogo ring 13, and the circuit boards 31, 32, and 33 extend vertically from these circuit boards 34 and 35, through the internal space of the inner circumference of the attachment board 14, to the internal space in the scope hole 26 of the testing head portion 25. Thus, the BOST device 30 is disposed utilizing the remaining space on the testing circuit board 11, specifically the internal spaces of the pogo ring 13, the attachment board 14, and the scope hole 26.

Figure 2:
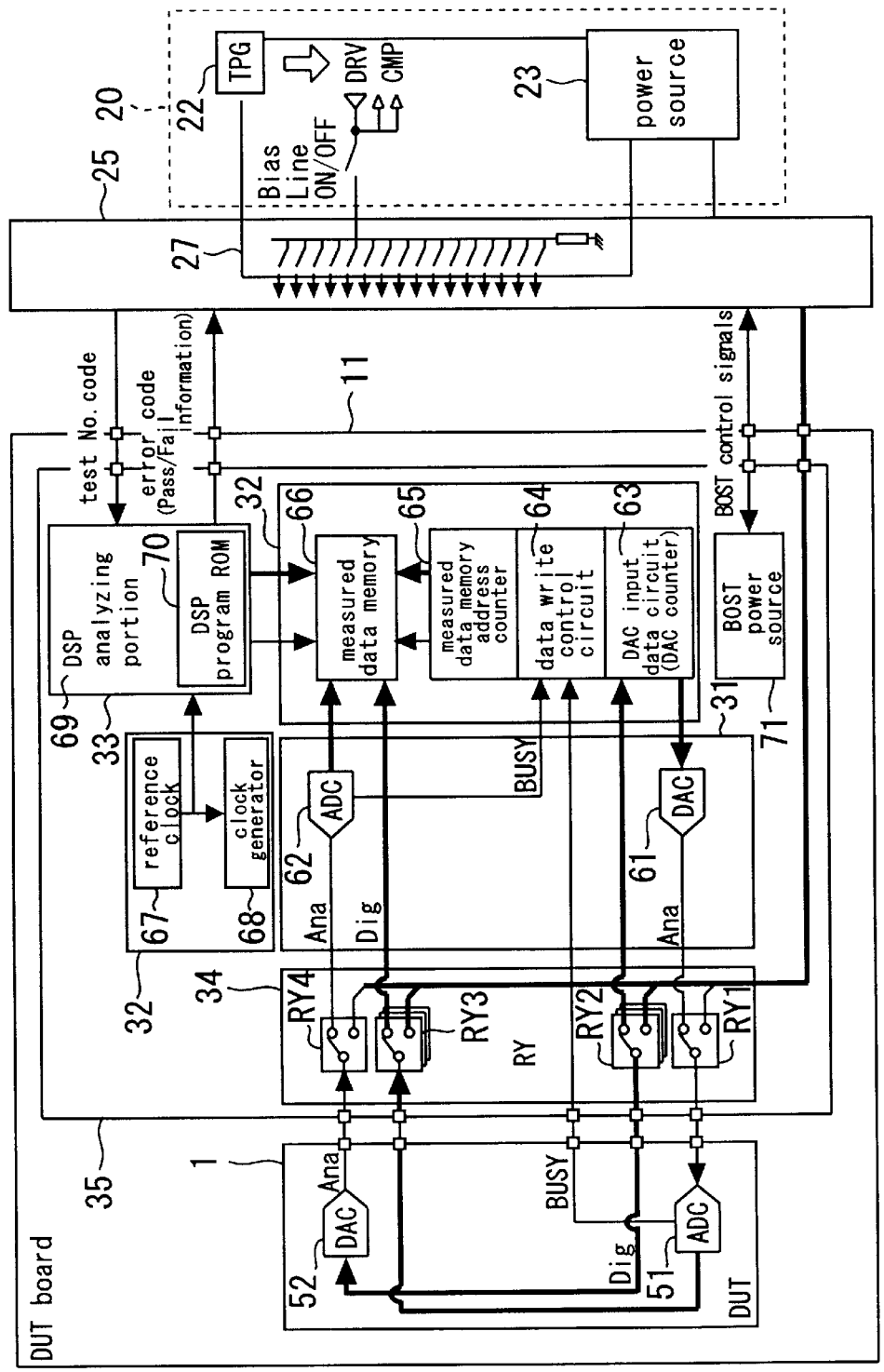
FIG. 2 is a block diagram that shows the configuration of an electric circuit in First Embodiment.

FIG. 2 is a block diagram that shows the configuration of an electric circuit in First Embodiment. The DUT 1 comprises an A/D converter circuit 51 that converts analog signals to digital signals, and a D/A converter circuit 52 that converts digital signals to analog signals. Although the DUT 1 practically comprises a large number of A/D converters 51 and a large number of D/A converters 52, only one A/D converter 51 and one D/A converter 52 are shown as representatives.

The BOST device 30 comprises a testing D/A converter circuit 61 that supplies analog test signals to the A/D converter circuit 51 of the DUT 1, and a testing A/D converter circuit 62 that converts analog test outputs from the D/A converter circuit 52 to digital test outputs. The BOST device 30 further comprises a DAC input data circuit (DAC counter) 63, a data write control circuit 64, a measured data memory address counter 65, a measured data memory 66, a reference clock circuit 67, a clock generator circuit 68, and a DSP analyzing portion 69. The DSP analyzing portion 69 comprises a DSP program ROM 70.

The BOST device 30 further comprises a BOST power source 71 and a relay circuit RY having a plurality of relays RY1 to RY4. The BOST power source 71 is a power source for supplying power voltages to every circuit in the BOST device 30; and the relay circuit RY switches the testing signals from the BOST device 30 to the DUT 1, and the testing signals from the testing head portion 25 to the DUT 1. The testing signals from the BOST device 30 to the DUT 1 contain analog testing signal form the D/A converter circuit 61 to the A/D converter circuit 51, and digital signals from the DAC input data circuit 63 to the D/A converter circuit 52. These testing signals can also be supplied directly from the testing head portion 25 by the switching of the relays RY1 and RY2. The testing signals from the testing head portion 25 also contains data that cannot be formed by the DAC input data circuit 63. On the switching of the testing signals, the relay circuit RY also switches the test output from the DUT 1. Although the analog test outputs form the A/D converter circuit 51 are normally supplied to the measured data memory 66, and the digital test outputs from the D/A converter circuit 52 are supplied to the measured data memory 66 through the A/D converter circuit 62, these test outputs are supplied to the testing head portion 25 from the relays RY3 and RY4. The testing signals from the testing head portion 25 also contains test signals for checking the connection between the BOST device 30 and the DUT 1, and testing signals for diagnosing the operation of the BOST device 30.

The D/A converter circuit 61 for testing and the A/D converter circuit 62 for testing are carried on the first circuit board 31 in FIG. 1; the DAC input data circuit 63, the data write control circuit 64, the measured data memory address counter 65, the measured data memory 66, the reference clock circuit 67, and the clock generator circuit 68 are carried on the second circuit board 32 in FIG. 1; and the DSP analyzing portion 69 is carried on the third circuit board 33 in FIG. 1. The interface substrate 34 in FIG. 1 carries the interconnection mechanism between circuit boards 31, 32, and 33, as well as the relay circuit RY. The interface substrate 35 in FIG. 1 carries the interconnection mechanism between the BOST device 30 and the testing circuit board 11 (testing head portion 25), as well as the BOST power source 71.

The mechanisms and circuit components carried by the circuit boards 31 to 33, and interface substrates 34 and 35 in First Embodiment are summarized as follows:

| | |
|---|---|
| First circuit board 31: | D/A converter circuit 61, A/D converter circuit 62 |
| Second circuit board 32: | DAC input counter 63, data write control circuit 64, measured data memory address counter 65, measured data memory 66, reference clock circuit 67, and clock generator circuit 68 |
| Third circuit board 33: | DSP analyzing portion 69 |
| Interface substrate 34: | Interconnection mechanism between circuit boards 31 through 33, and relay circuit RY |
| Interface substrate 35: | Interconnection mechanism between BOST device and testing circuit board 11 (testing head portion), and BOST power source 71 |

The test instruction signals are supplied for the test machine 20. The instruction contains the test number code. The instruction is supplied to the testing head portion 25, from which the instruction is supplied through the attachment board 14 and the pogo ring 13 to the testing circuit board 11. The instruction is further supplied from the testing circuit board through the interface substrate 35 of the BOST device 30 and the interface substrate 34 to the circuit board 32. Digital signals for testing (test data) are stored in the DAC input data circuit 63 carried by the circuit board 32, the test data from the DAC input data circuit 63 are supplied to the D/A converter circuit 52 of the DUT 1 through interface substrates 34, 35, and the testing circuit board 11, and also to the D/A converter circuit 61 for testing on the circuit board 31.

Digital test signals (test data) supplied to the testing D/A converter circuit 61 are converted to analog test signals, and supplied to the A/D converter circuit 51 of the DUT 1 through interface substrates 34, 35 from circuit board 31, and the testing circuit board 11. The test data are converted by the A/D converter circuit 51 of the DUT 1 to digital test outputs, and supplied to the measured data memory 66 carried by the circuit board 32 through the testing circuit board 11, and the interface substrates 35 and 34.

On the other hand, the digital test signals supplied from the DAC input data circuit 63 to the D/A converter circuit 52 of the DUT 1 are converted to the analog test outputs in the D/A converter circuit 52, and supplied to the A/D converter circuit for testing 62 on the circuit board 31 through the testing circuit board 11, and the interface substrate 35 and 34, and converted to digital test outputs. The converted outputs are supplied to the measured data memory 66 on the circuit board 32 through the interface substrate 34.

The measured data memory 66 stores the digital test outputs supplied from the A/D converter circuit 51 of the DUT 1, and the digital test outputs supplied from the D/A converter circuit 52 through the A/D converter circuit 62 sequentially in the predetermined addresses.

The A/D converter circuit 51 of the DUT 1 and the A/D converter circuit 62 of the BOST device 30 convert analog signals to digital signals sequentially, and output BUSY signals each time one digital signal is generated. These BUSY signals are supplied to the data write control circuit 64 on the circuit board 32 of the BOST device 30. BUSY signals from the A/D converter circuit 51 of the DUT 1 are supplied to the data write control circuit 64 through the testing circuit board 11, and the interface substrates 35 and 34; and BUSY signals from the A/D converter circuit 62 are supplied from the circuit board to the circuit board 32 through the interface substrate 34. Based on the supplied BUSY signals, the data write control circuit 64 advances the digital test data of the DAC input data circuit 63 sequentially to next digital test data for each data unit, and act to advance the address of the measured data memory 66 for the measured data memory address counter 65.

Thus, by BUSY signals, since the codes of the digital test data converted in the DUT 1 are advanced in the DAC input data circuit 63, and in the measured data memory 66 the addresses to store digital test outputs converted in the DUT 1 are sequentially advanced, and therefore conversion test required for the test is sequentially performed in the A/D converter circuit 51 and the D/A converter circuit 52 in the DUT 1, and the converted measured data are sequentially stored in the measured data memory 66. Thereafter, conversion is continued until the last code set in the DSP analyzing portion 69 of the BOST device 30, and all the results are stored in the measured data memory 66.

After the completion of the converting test by the A/D converter circuit 51 and the D/A converter circuit 52 in the DUT 1, the DSP analyzing portion 69 on the circuit board 33 of the BOST device 30 reads sequentially the converted data stored in the measured data memory 66 using the program stored in the DSP program ROM 70, and analyzes the conversion properties. This analysis include the calculations of the A/D conversion property parameters, D/A conversion property parameters, differential linearity, integral non-linear error, and the like, and an error code indicating the result of analysis (pass/fail information) is transmitted from the DSP analyzing portion 69 on the BOST device 30, through the interface substrates 34 and 35, the testing circuit board 11, the pogo ring 13, the attachment board 14, and the testing head portion 25, to the test machine (the main body of the tester) 20, where the test results are processed.

The test machine 20 has a test-pattern generator (TPG) 22 and the power source 23 in the main body thereof, and has the pin-electronics portion 27 in the testing head portion 25. The test machine 20 supplies the power-source voltage Vd to the BOST power source 71, and transmits the BOST control signals BC to and receive the BOST control signals from the BOST device 30. The supply of the power-source voltage Vd and the communication of the BOST control signals BC are performed from the testing head portion 25, through the attachment board 14 and the pogo ring 13, to the testing circuit board 11; and the power-source voltage Vd is supplied to the BOST power source 71 on the interface substrate 35. The test analysis numbers or codes inputted to the BOST device 30 from the test machine 20 are generated by the test-pattern generator 22 incorporated in the test machine 20, on the basis of the testing-signal conditions described in the test program, as test-pattern signals similarly to the test of other DUTs 1, and are supplied to the testing circuit board 11 and the BOST device 30 through the pin-electronics portion 27 of the testing head portion 25. On the other hand, the results of test analysis (pass/fail information) outputted from the BOST device 30 are transmitted to the pin-electronics portion 27 of the testing head portion 25, and the result information is taken based on comparison with test-pattern signals and determination by the determining portion of the pin-electronics portion 27.

In First Embodiment, since five circuit boards 31 to 35 constituting the BOST device 30 are disposed in the vicinity of the testing circuit board 11, and has the function to conduct the conversion test of the A/D converter circuit 51 and the D/A converter circuit 52 of the DUT 1, this conversion test can be conducted on the BOST device 30. As a result, the analog measurement system line between the testing circuit board 11 and the BOST device 30 can be shortened, the occurrence of measurement errors due to noise can be restricted sufficiently, the high-accuracy test can be realized, and based on transmitting and receiving of signals between the testing circuit board 11 and the nearby BOST device 30, the test can be conducted at a high speed. Since the analog measurement system line can be eliminated between the BOST device 30 and the test machine 20, the accuracy of the test can be improved. Also, since the required conversion test is completed on the BOST device 30, and the results are transmitted to the test machine 20, the test speed can be improved compared with the ones to transmit converted data to the test machine 20.

In First Embodiment, since the conversion test function of the A/D converter circuit 51 and the D/A converter circuit 52 is disposed on the BOST device 30, the large function therefor is not required to add to the test machine 20, and increase in the costs of the test machine 20 can be prevented, and even a conventional low-speed test machine can be utilized. When a test machine 20 having a special measurement function is manufactured, since the expansion of functions by a hardware configuration is limited, and the improvement of the test machine itself is required, the costs for development may increase. According to First Embodiment, since the test pattern generator and pin electronics typically used in conventional test machines are utilized, the BOST device can be configured and controlled without being affected by various specifications and restrictions of the test machines, and application to various test machines can be made.

Figure 3:
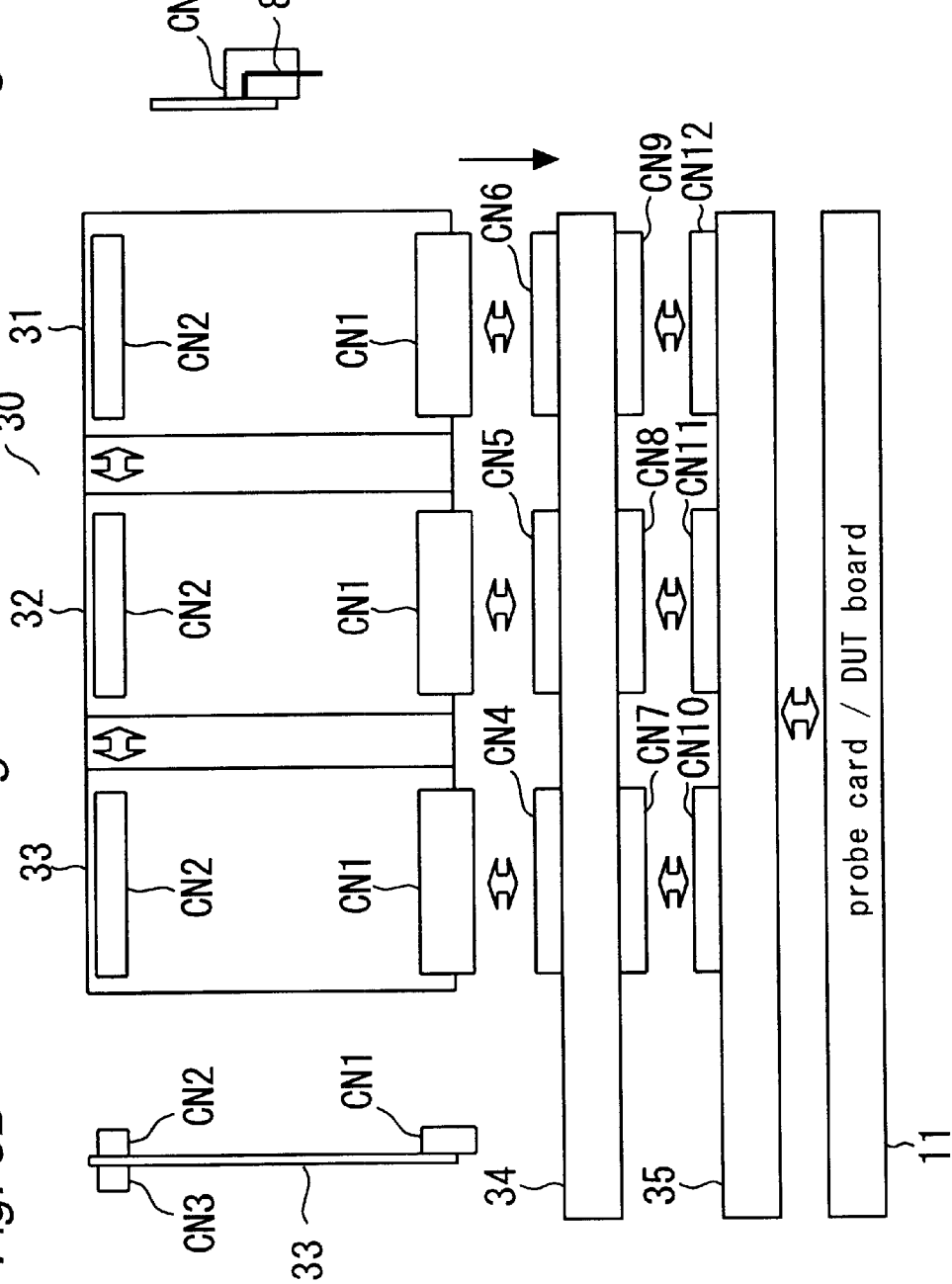
FIGS. 3A to 3C are diagrams to show the substrate constitution of the BOST device 30 according to First Embodiment.
Figure 4:
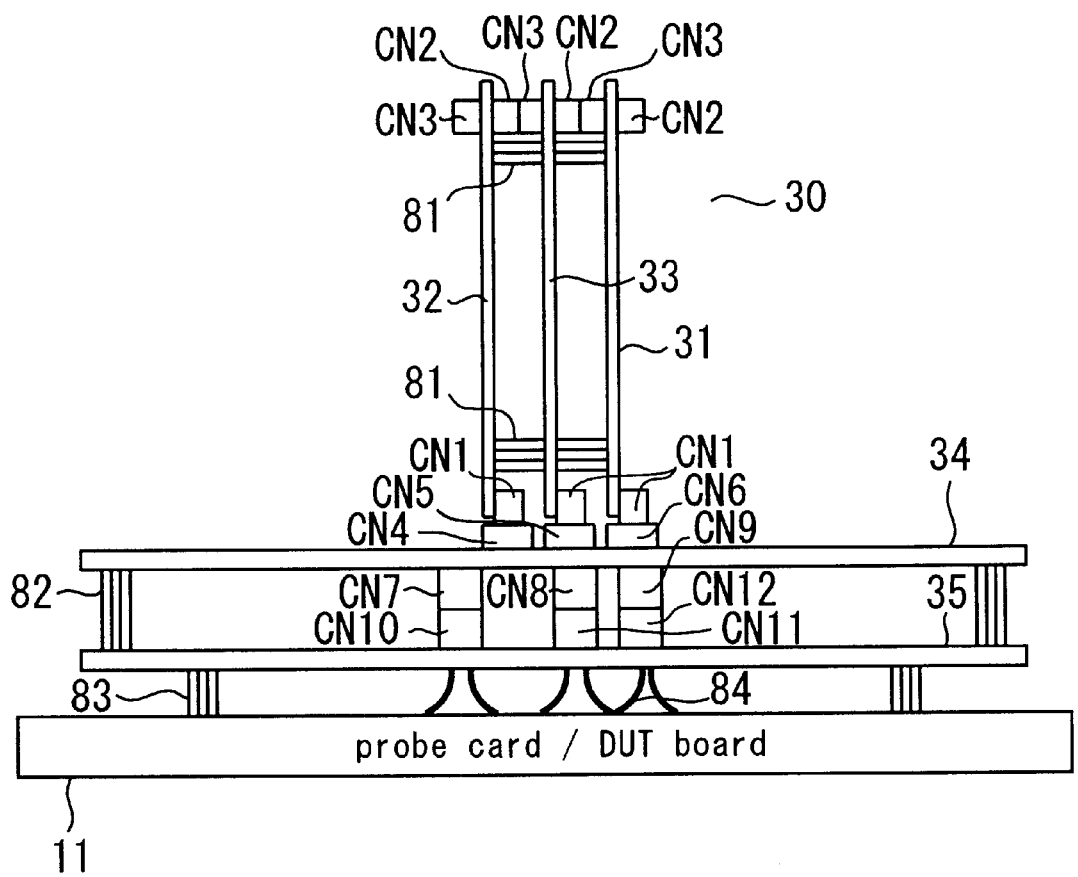
FIG. 4 is the side view of a substrate assembly of the BOST device 30 according to First Embodiment.

Now, the substrate constitution of the BOST device 30 according to First Embodiment will be described below in further detail referring to FIGS. 3A, 3B, 3C, 4, and 5. FIG. 3A is a cutout diagram of the substrate constitution of the BOST device 30 according to First Embodiment; FIG. 3B is a side view thereof; and FIG. 3C is a constitution diagram of an angle-type connector. FIG. 4 is the side view of a substrate assembly of the BOST device 30 according to First Embodiment; and FIG. 5 is a perspective view showing the assembled appearance thereof.

First, the concept of substrate constitution will be described. As FIG. 3A shows, circuit boards 31, 32, and 33 are rectangular substrates with a little longer longitudinal sides, the upper ends of which are provided with straight-type connectors CN2 and CN3 for connecting in the thickness direction of the substrates on top and bottom surfaces, respectively; and the lower ends of which are provided with angle-type connectors CN1 for connecting in the direction parallel to the major surfaces of the substrates. As FIG. 3A shows, the angle-type connector CN1 is a plug-in connector parallel to the major surfaces of the substrate, in which a signal pin 80 is bent perpendicularly in the middle. The straight-type connectors CN2 and CN3 are ordinary plug-in connectors in which signal pins 80 are perpendicular to the substrates. The upper surface of the interface substrate 34 is provided with three straight-type connectors CN4, CN5, and CN6 to which the angle-type connectors CN1 of the circuit boards 31, 32, and 33 are perpendicularly inserted; and the lower surface thereof is provided with straight-type connectors CN7, CN8, and CN9 for connecting to the interface substrate 35. The upper surface of the interface substrate 35 is provided with straight-type connectors CN10, CN11, and CN12 for connecting to the interface substrate 34. For connecting the interface substrate 35 to the testing circuit board 11, either (a) fixed wiring connection using a cable, (b) interconnection using a connector, or (c) cable connection through a connector is used. Although (a) is non-detachable, (b) and (c) are detachable.

FIG. 4 is a side view showing the state where circuit boards 31, 32, and 33, and interface substrates 34 and 35 are assembled. The circuit boards 31, 32, and 33 are assembled in the state where connectors CN2 and CN3 on the upper ends are fitted to each other, and the connectors CN1 on the lower ends are fitted to the connecters CN4, CN5, and CN6 of the interface substrate 34. Spacers 81 are disposed between circuit boards 31 and 32, and 32 and 33. The interface substrate 34 is assembled by fitting the connecters CN7, CN8, and CN9 to the connecters CN10, CN11, and CN12 of the interface substrate 35. Pillars or spacers 82 are disposed between interface substrates 34 and 35. The interface substrate 35 is installed above the testing circuit board 11 via spacers 83, and in the example of FIG. 4, the interface substrate 35 is mechanically fixed above and electrically connected to the testing circuit board 11 using fixed wiring connection 84.

Figure 5:
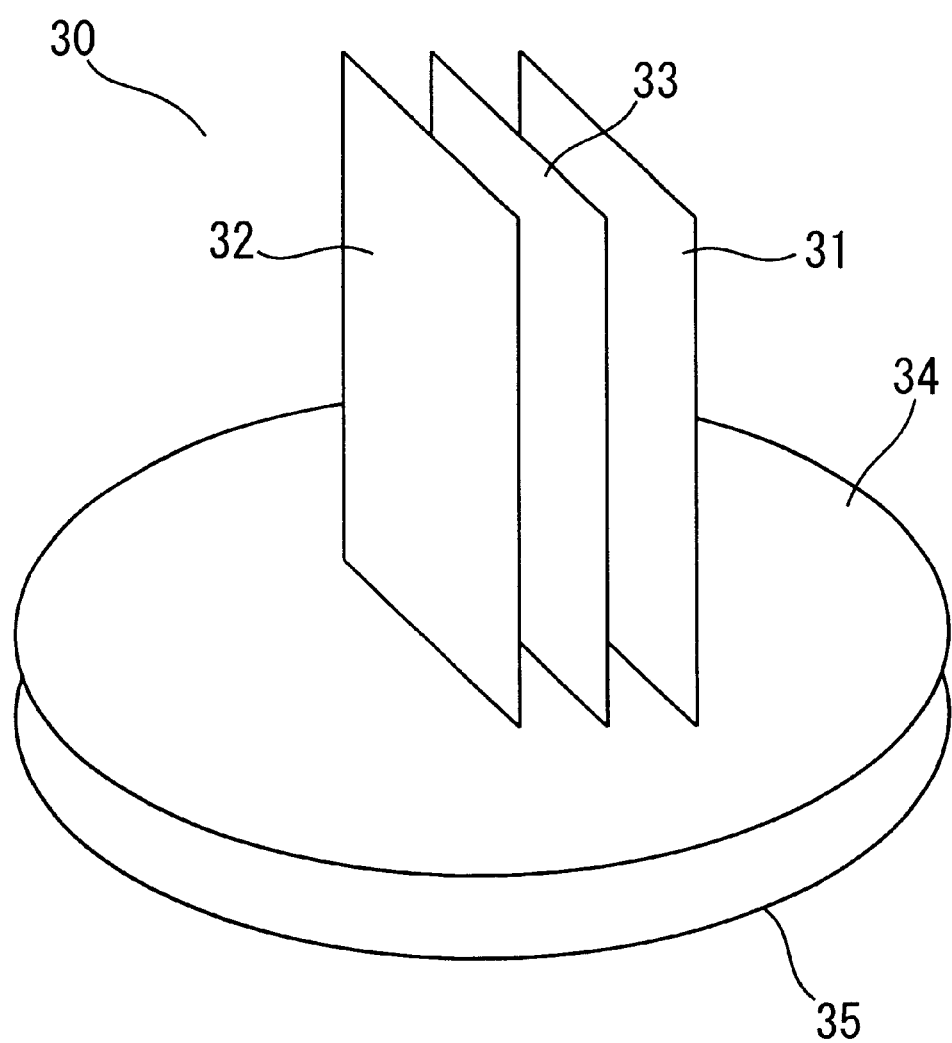
FIG. 5 is a perspective view showing the assembled appearance of the BOST device 30.

As FIG. 5 shows, the rectangular circuit boards 31, 32, and 33 are disposed so as to be parallel to each other, and assembled on the interface substrate 34 of circular interface substrates 34 and 35. The interface substrate 35 is installed on and electrically connected to the testing circuit board 11. The interface substrates 34 and 35 are disposed in the internal space of the pogo ring 13, and circuit boards 31, 32, and 33 rise vertically from the interface substrates 34 and 35, pass through the internal space of the attachment board 14, and extend to the internal space of the scope hole 26 of the testing head portion 25. Although the reason why interface substrates 34 and 35 are constituted as circular substrate is that spaces for accommodating BOST devices of many commercially available test machines are circular, the shape is not limited to circular, but the substrates of other shapes, such as square and rectangular, may of course be used.

Thus, by making the BOST device 30 be modularized by five circuit boards 31 to 35 according to required BOST functions to be divided constitution, the size of the BOST device 30 can be reduced, and a space between the testing circuit board 11 and the testing head portion 25 can be utilized effectively by installing the BOST device 30 in such a space. In addition, the modularization of the BOST device 30 improves the flexibility of the BOST device 30 to the expansion of functions and the change of device constitution. For example, by making circuit boards 31 and 32, and the interface substrate 35 from standard substrates, and replacing or changing the circuit board 33 and the interface substrate 34 according to the object of measurement, the standard substrates can be recycled easily, and the costs can be reduced.

Second Embodiment

Figure 6:
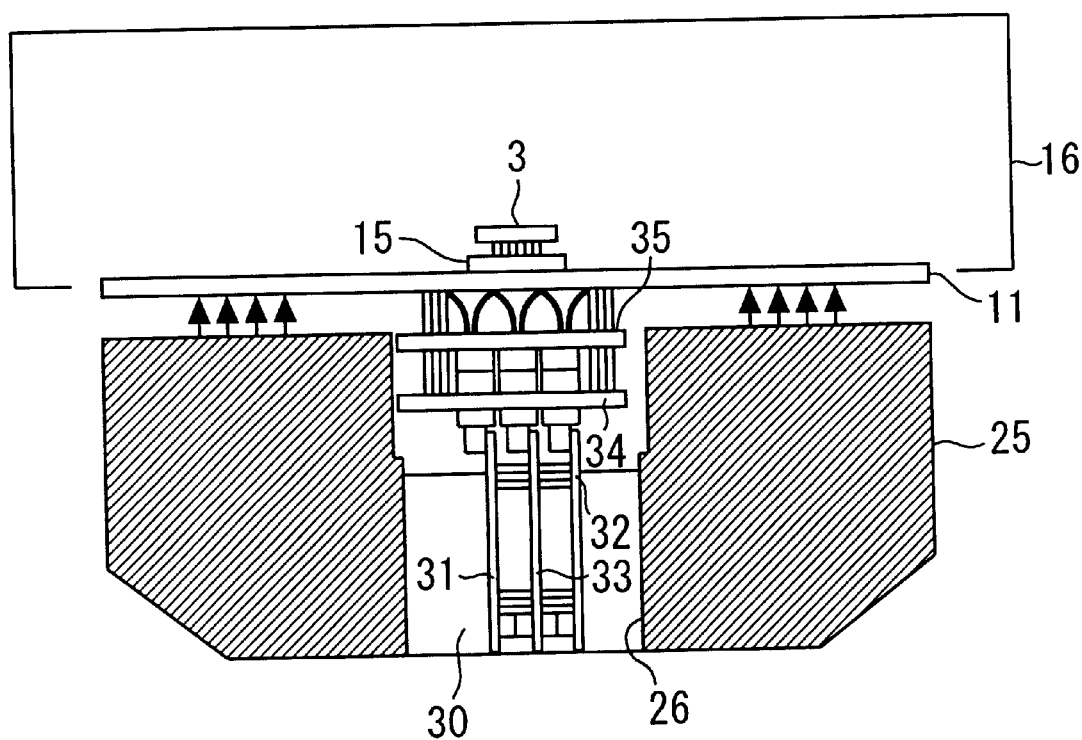
FIG. 6 is a side view that shows the DUT portion of Second Embodiment of a tester for semiconductor integrated circuits according to the present invention.

FIG. 6 is a side view that shows the DUT portion of Second Embodiment of a tester for semiconductor integrated circuits according to the present invention. In Second Embodiment, the testing head portion 25 of First Embodiment is placed upside down, and the testing circuit board 11 is disposed above the testing head portion 25. The testing circuit board 11 in Second Embodiment is a DUT board having a DUT socket 15 installed on the center of the upper surface thereof, and a molded IC conveyed by the conveyer (handler) 16 of the semiconductor integrated circuit is inserted in the socket 15 as DUT1. Second Embodiment is a tester used in the final process of manufacturing a semiconductor integrated circuit, and a molded and completed semiconductor integrated circuit, that is, a molded IC that has been sealed with a molding resin, and has a plurality of terminals protruding from the molding resin, is tested.

In Second Embodiment, although the BOST device 30 is constituted as in First Embodiment, it is installed underneath the testing circuit board 11 in the state where it is hung from the testing circuit board 11 with fixed wiring connection 84, inversely from First Embodiment. Specifically, a circular interface substrate 35 is placed in the uppermost position, a circular interface substrate 34 is disposed under and in parallel to the interface substrate 35, and rectangular circuit boards 31, 32, and 33 parallel to each other are disposed in the state where they are hung vertically from the interface substrate 34. Interface substrates 34 and 35 are disposed on the upper portion of the scope hole 26 of the testing head portion 25 in parallel to the testing circuit board 11, and the circuit boards 31, 32, and 33 are also disposed in the internal space of the scope hole 26, thus utilizing the space efficiently as in First Embodiment.

Third Embodiment

Figure 7:
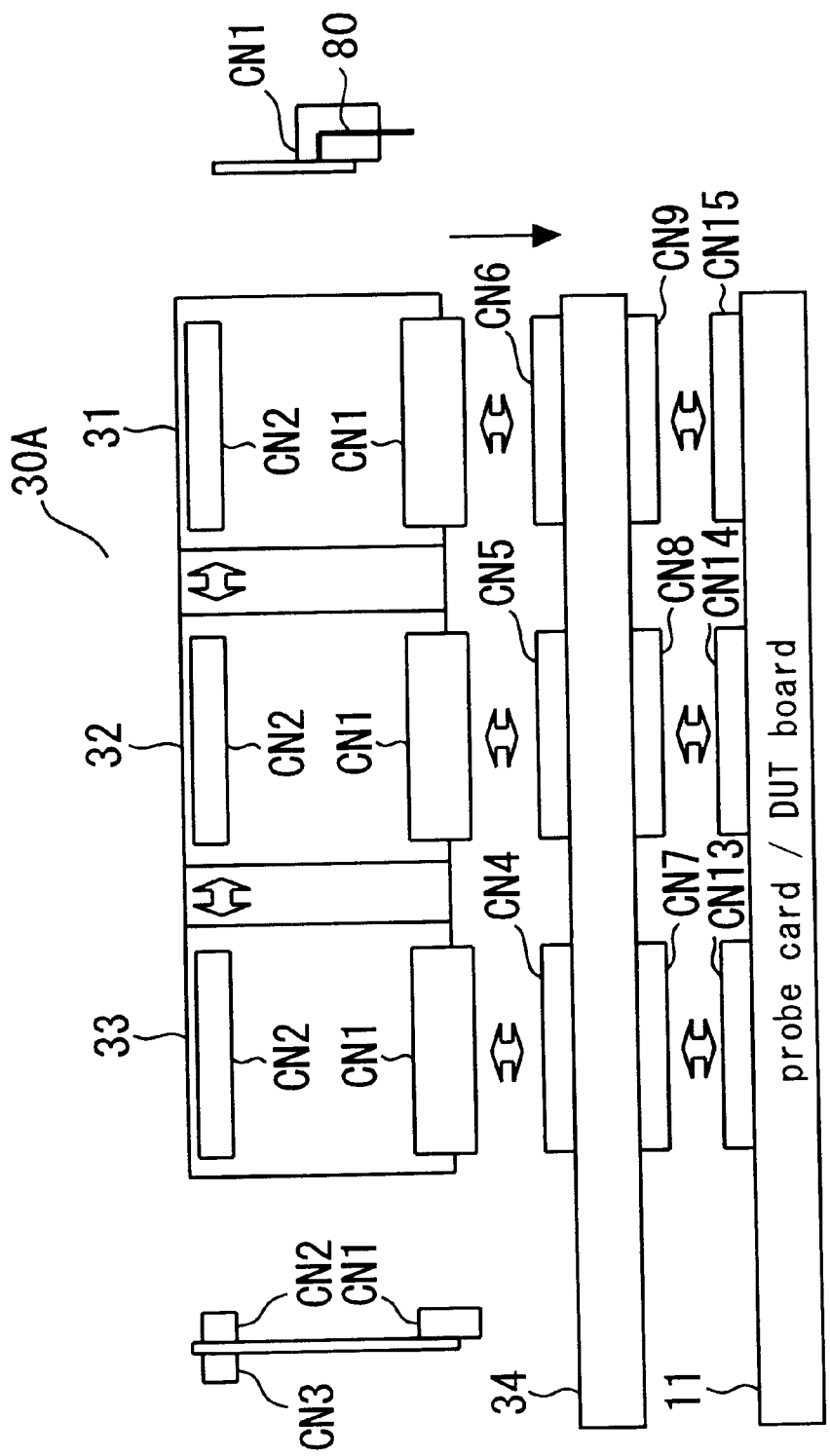
FIGS. 7A to 7C are cutout diagrams of the substrate constitution of a BOST device 30A in Third Embodiment.
Figure 8:
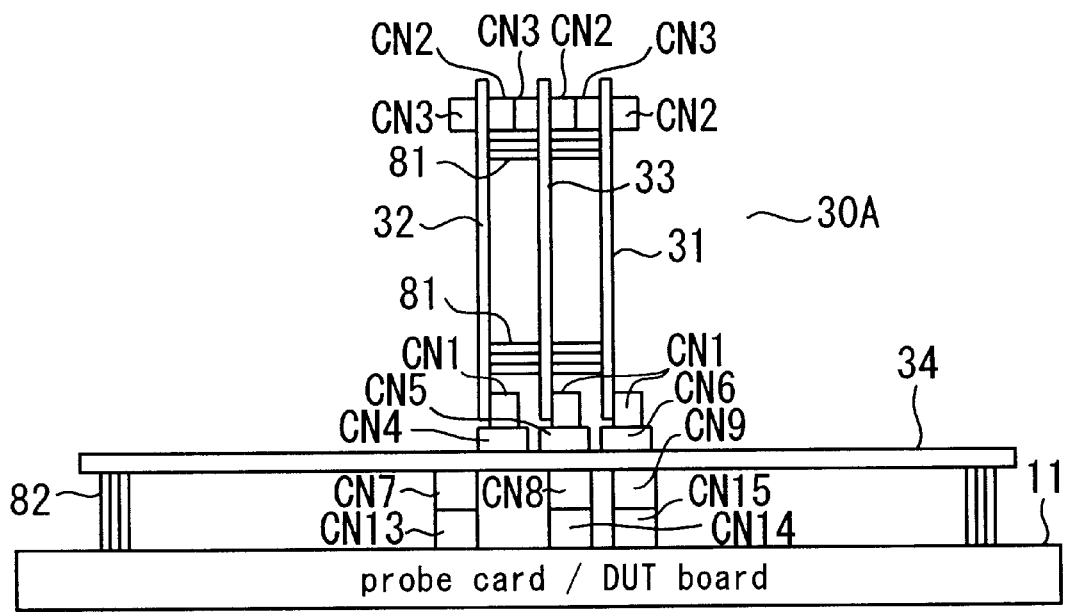
FIG. 8 is a side view showing a specific constitution of the BOST device 30A according to Third Embodiment.

FIG. 7 is a cutout diagram of the substrate constitution of a BOST device 30A in Third Embodiment. FIG. 7A is a front view, FIG. 7B is a side view of circuit boards 31 to 33, and FIG. 7C is a constitution diagram of an angle-type connector CN1. FIG. 8 is a side view showing a specific constitution of the BOST device 30A according to Third Embodiment. The BOST device 30A in Third Embodiment is also incorporated in testers shown in FIGS. 1 and 6.

The BOST device 30A of Third Embodiment is constituted by four circuit boards 31 to 34 omitting an interface substrate 35. Except the omission of the interface substrate 35, other constitutions are same as the constitutions shown in FIGS. 3 and 4, and the same components are indicated with the same reference numerals. In the BOST device 30A, an interface substrate 34 has an interconnection function between circuit boards 31, 32, and 33, as well as an interconnection function with the testing circuit board 11, the test machine 20, and the testing head portion 25. Although a BOST power source 71 is carried by the interface substrate 35 shown in FIGS. 3 and 4, the BOST power source 71 of the BOST device 30A is carried by the testing circuit board 11 or the circuit board 33. Connectors CN7, CN8, and CN9 on the bottom surface of the interface substrate 34 are fitted in straight-type connectors CN13, CN14, and CN15 provided on the upper surface of the testing circuit board 11 in a plug-in form, respectively.

In Third Embodiment, the number of circuit boards is 4, and fewer circuit boards can constitute a smaller BOST device 30A compared with the BOST device 30 of First Embodiment.

Fourth Embodiment

Figure 9:
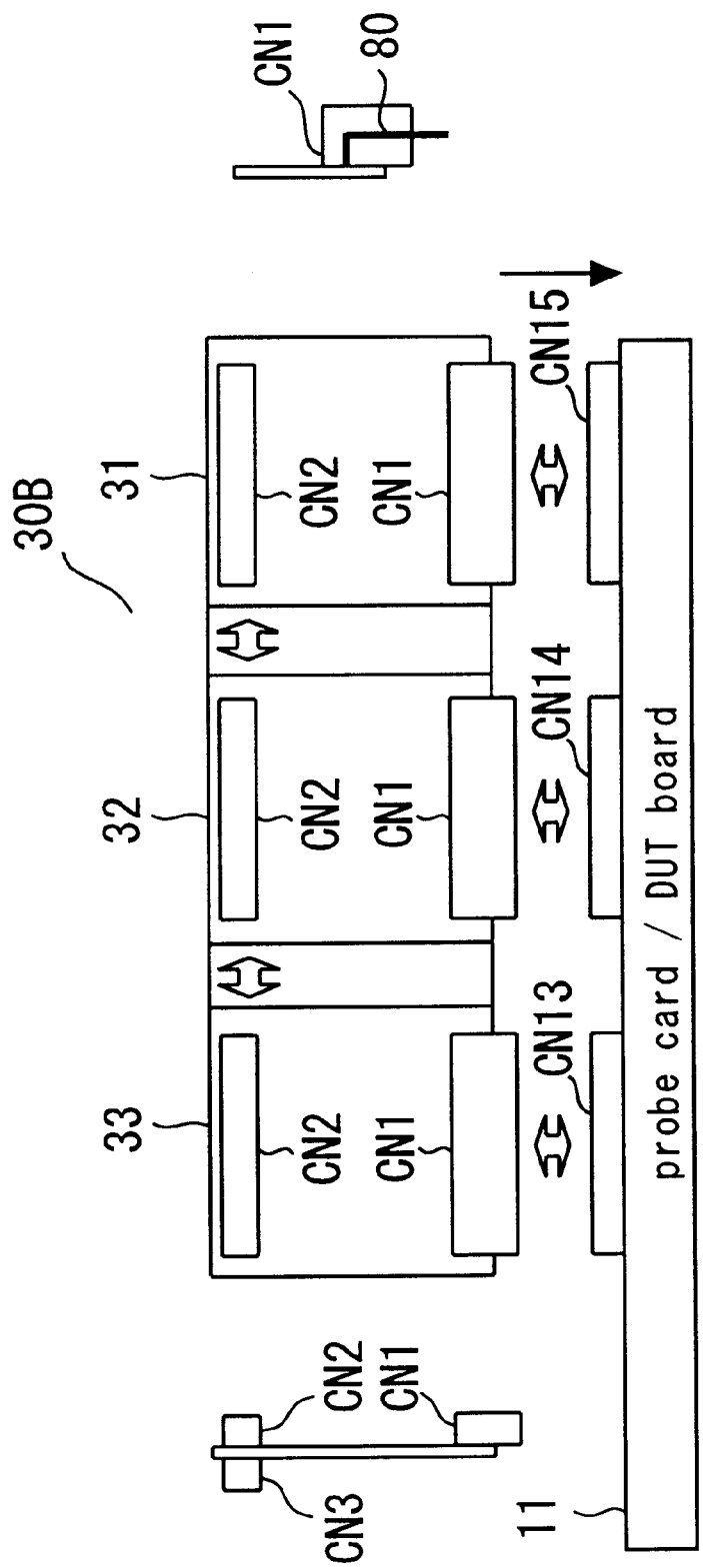
FIGS. 9A to 9C are cutout diagrams of the substrate constitution of a BOST device 30B in Fourth Embodiment.
Figure 10:
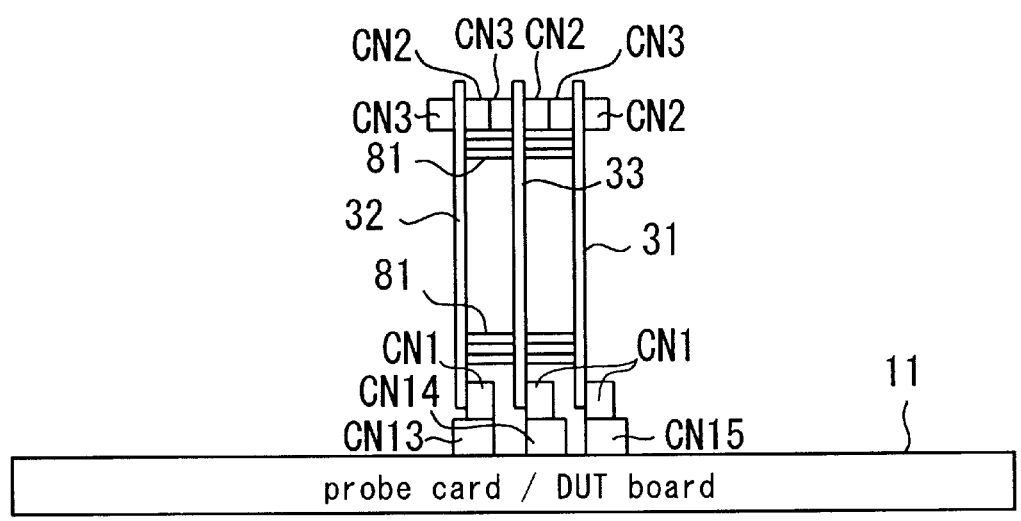
FIG. 10 is a side view showing a specific constitution of the BOST device 30B according to Fourth Embodiment.

FIG. 9 is a cutout diagram of the substrate constitution of a BOST device 30B in Fourth Embodiment. FIG. 9A is a front view, FIG. 9B is a side view of circuit boards 31 to 33, and FIG. 9C is a constitution diagram of an angle-type connector CN1. FIG. 10 is a side view showing a specific constitution of the BOST device 30B according to Fourth Embodiment. The BOST device 30B in Fourth Embodiment is also incorporated in testers shown in FIGS. 1 and 6.

The BOST device 30B of Fourth Embodiment is constituted by three circuit boards 31 to 33 omitting interface substrates 34 and 35. Except the omission of the interface substrates 34 and 35, other constitutions are same as the constitutions shown in FIGS. 3 and 4, and the same components are indicated with the same reference numerals. In the BOST device 30B, the testing circuit board 11 has an interconnection function between circuit boards 31, 32, and 33, as well as an interconnection function between the BOST device 30B and the test machine 20 and the testing head portion 25. Although a BOST power source 71 is carried by the interface substrate 35 shown in FIGS. 3 and 4, the BOST power source 71 of the BOST device 30B is carried by the testing circuit board 11 or the circuit board 33. The relay circuit RY carried by the interface substrate 35 shown in FIGS. 3 and 4 is carried by the testing circuit board 11 or the circuit board 31. The circuit board 31 carries the relay circuit RY, as well as the D/A converter circuit 61 and the A/D converter circuit 62. An angle-type connector CN1 on the bottom surface of the interface substrate 34 is fitted in straight-type connectors CN13, CN14, and CN15 provided on the upper surface of the testing circuit board 11 in a plug-in form, and in the parallel direction to the major surfaces of the circuit boards 31, 32, and 33.

In Fourth Embodiment, the number of circuit boards is three, and fewer circuit boards can constitute a smaller BOST device 30B compared with the BOST device 30 of First Embodiment.

Fifth Embodiment

Figure 11:
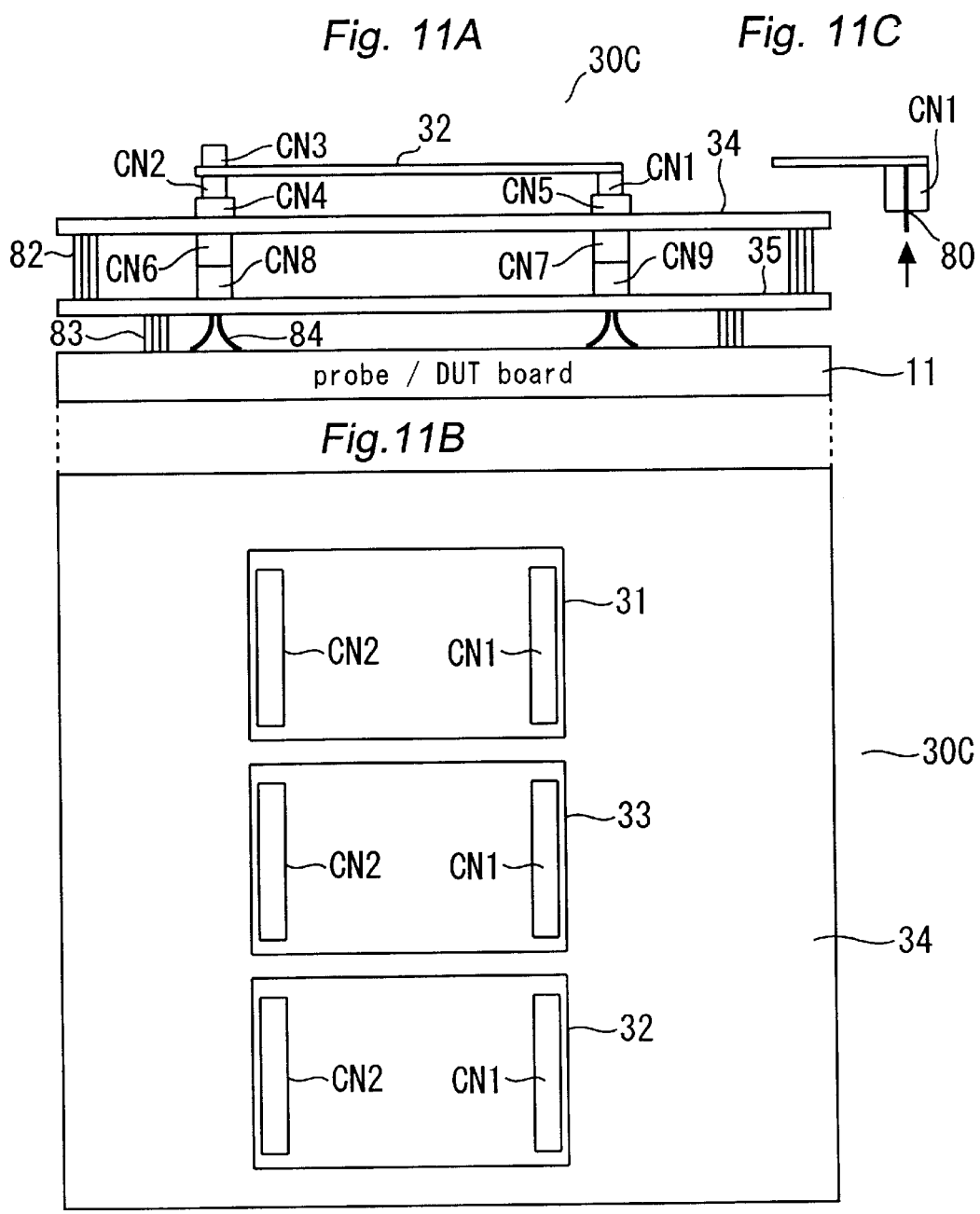
FIGS. 11A to 11C are diagrams to show the substrate constitution of the BOST device 30 according to Fifth Embodiment.

Fifth Embodiment is the use of a BOST device 30C comprising three circuit boards 31, 32, and 33 disposed in a line on a common plane parallel to the testing circuit board 11. FIG. 11A is a side view showing the substrate constitution of the BOST device 30C, FIG. 11B is a front view thereof, and FIG. 11C is a diagram showing a straight-type connector used in Fifth Embodiment. The BOST device 30C in Fifth Embodiment is also incorporated in testers shown in FIGS. 1 and 6.

In Fifth Embodiment, rectangular interface substrates 34 and 35 are used, and these interface substrates 34 and 35 are disposed on the testing circuit board 11 in parallel to the testing circuit board 11 so as to overlap each other with an interval. The interface substrate 35 is disposed immediately above the testing circuit board 11, and is mechanically fixed and electrically connected to the testing circuit board 11 with fixed wiring connection 84. The interface substrate 34 is disposed above the interface substrate 35 via pillars or spacers 82. Three rectangular circuit boards 31, 32, and 33 are disposed on the interface substrate 34 in a line. These circuit boards 31, 32, and 33 are disposed on a common plane parallel to the testing circuit board 11. The functions and circuit components carried by the circuit boards 31 to 33 and interface substrates 34 and 35 are the same as those described in Paragraph 0047.

A connector CN1 is disposed on the bottom surface of the right-end portion of each of circuit boards 31, 32, and 33; and a connector CN2 is disposed on the upper surface of the left-end portion of each of circuit boards 31, 32, and 33.

Three connectors CN4 and three connectors CN5 are disposed on the upper surface of the interface substrate 34, and the connectors CN1 and CN2 on the circuit boards 31, 32, and 33 are fitted to these connectors CN4 and CN5, respectively. Connectors CN6 and CN7 are disposed on the bottom surface of the interface substrate 34, and these connectors CN6 and CN7 are fitted to the connectors CN8 and CN9 of the upper surface of the interface substrate 35, respectively. All the connectors used in Fifth Embodiment are straight-type connectors as shown in FIG. 11C.

The BOST device 30C of Fifth Embodiment is especially suited when the circuit boards 31 to 33 can be stacked, and there is limitation in the dimension in the vertical direction.

Sixth Embodiment

Figure 12:
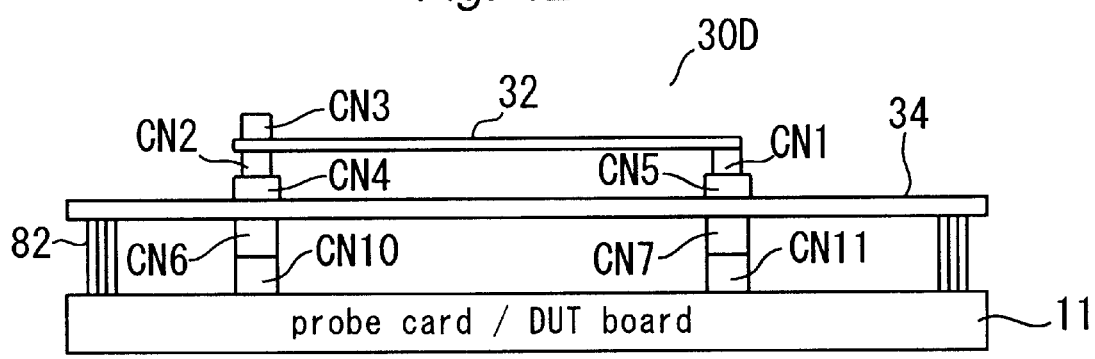
FIG. 12 is a side view of the substrate constitution of the BOST device 30D according to Sixth Embodiment.

Sixth Embodiment is the use of a BOST device 30D in which the interface substrate 35 is removed from the constitution of the BOST device 30C of Fifth Embodiment as in Third Embodiment, and a side view of the substrate constitution of the BOST device 30D is shown in FIG. 12. The BOST device 30D in Sixth Embodiment is also incorporated in testers shown in FIGS. 1 and 6.

Since the interface substrate 35 is removed, the connectors CN6 and CN7 on the bottom surface of the interface substrate 34 are fitted to straight-type connectors CN10 and CN11 provided on the upper surface of the testing circuit board 11, respectively. The interface substrate 34 has an interconnection function between circuit boards 31, 32, and 33, as well as an interconnection function with the testing circuit board 11, the testing head portion 25 connected thereto, and the test machine 20, and carries the relay circuit RY. In Sixth Embodiment, the BOST power source 71 carried by the interface substrate 35 in the previous embodiments is carried by the testing circuit board 11 or the circuit board 33.

Since the number of circuit boards can be reduced to four in Sixth Embodiment, a smaller BOST device 30D compared with Fifth Embodiment can be realized.

Seventh Embodiment

Figure 13:
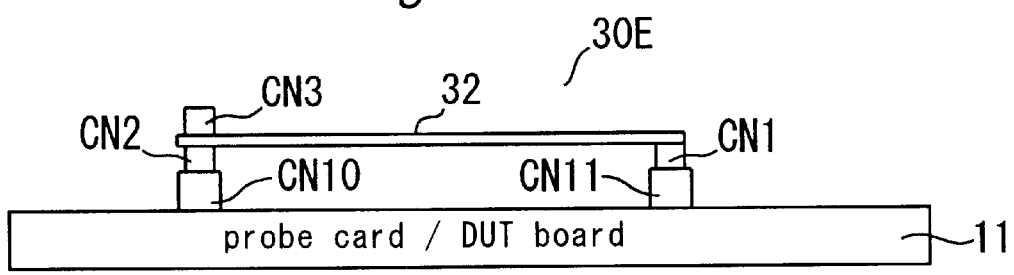
FIG. 13 is a side view of the substrate constitution of the BOST device 30E according to Seventh Embodiment

Seventh Embodiment is the use of a BOST device 30E in which the interface substrates 34 and 35 are removed from the BOST device 30C of Fifth Embodiment as in Fourth Embodiment. A side view of the substrate constitution of the BOST device 30E is shown in FIG. 13. The BOST device 30E is also incorporated in testers shown in FIGS. 1 and 6.

Since the interface substrates 34 and 35 are removed, the connectors CN1 and CN2 on the bottom surface of each of the circuit boards 31, 32, and 33 are fitted to the connectors CN10 and CN11 provided on the upper surface of the testing circuit board 11, respectively. On the upper surface of the testing circuit board 11, there are disposed at least three connectors CN10 to which the connectors CN1 of each of circuit boards 31, 32, and 33 are fitted, respectively, and at least three connectors CN11 to which the connectors CN2 of each of circuit boards 31, 32, and 33 are fitted, respectively. The testing circuit board 11 has an interconnection function between circuit boards 31, 32, and 33, as well as an interconnection function with the testing circuit board 11, the testing head portion 25 connected thereto, and the test machine 20. In Seventh Embodiment, the BOST power source 71 carried by the interface substrate 35 in the previous embodiments is carried by the testing circuit board 11 or the circuit board 33, and the relay circuit RY carried by the interface substrate 34 in the previous embodiments is carried by the testing circuit board 11 or the circuit board 31.

Since the number of circuit boards can be reduced to three in Seventh Embodiment, a smaller BOST device 30E compared with Fifth Embodiment can be realized.

Eighth Embodiment

Figure 14:
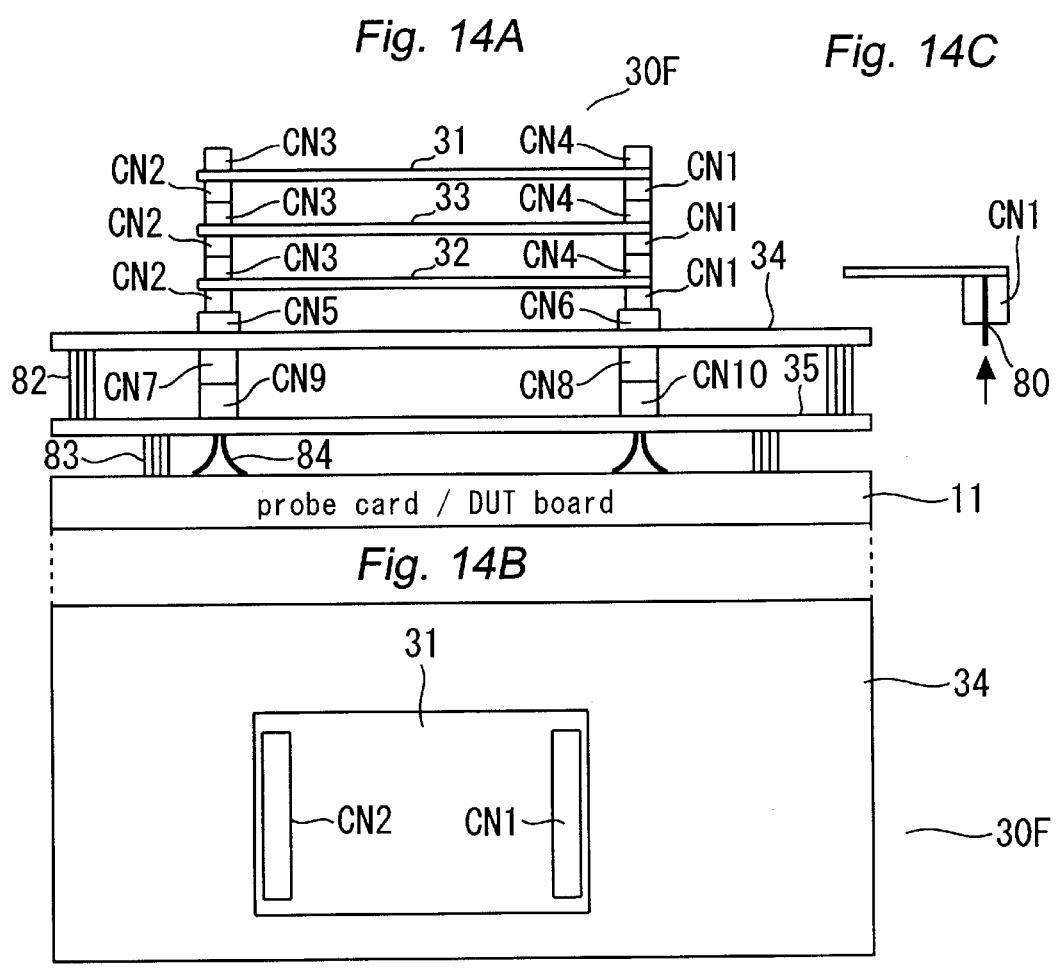
FIGS. 14A to 14C are diagrams to show the substrate constitution of the BOST device 30F according to Eighth Embodiment.

Eighth Embodiment is the use of a BOST device 30F of the constitution in which three circuit boards 31, 32, and 33 are stacked in parallel to the testing circuit board 11 with an interval between each other. FIG. 14A is a side view showing the substrate constitution of the BOST device 30F, FIG. 14B is a front view thereof, and FIG. 14C is a diagram showing a straight-type connector used in Eighth Embodiment. The BOST device 30F in Eighth Embodiment is also incorporated in testers shown in FIGS. 1 and 6.

In Eighth Embodiment, rectangular interface substrates 34 and 35 are used, and these interface substrates 34 and 35 are disposed on the testing circuit board 11 in parallel to the testing circuit board 11 so as to overlap each other with an interval. The interface substrate 35 is disposed immediately above the testing circuit board 11, and is mechanically fixed and electrically connected to the testing circuit board 11 with fixed wiring connection 84. The interface substrate 34 is disposed above the interface substrate 35 via pillars or spacers 82. Three rectangular circuit boards 31, 32, and 33 are disposed on the interface substrate 34 in a line. These circuit boards 31, 32, and 33 are disposed on the interface substrate 34 parallel to each other. The circuit board 32 is disposed immediately above the interface substrate 34, the circuit board 33 is disposed above the circuit board 32, and the circuit board 31 is disposed above the circuit board 33. Although the functions and circuit components carried by the circuit boards 31 to 33 and interface substrates 34 and 35 are the same as those described in Paragraph 0047, the interconnecting function between the circuit boards 31, 32, and 33 is omitted from the interface substrate 34, because the connectors disposed between the circuit boards 31, 32, and 33 have the interconnecting function.

A connector CN1 is disposed on the bottom surface of the right-end portion of each of circuit boards 31, 32, and 33; and a connector CN4 is disposed on the upper surface thereof. A connector CN2 is disposed on the bottom surface of the left-end portion of each of circuit boards 31, 32, and 33; and a connector CN3 is disposed on the upper surface thereof. The connectors CN1 and CN2 of the circuit board 31 are fitted to the connectors CN4 and CN3 of the circuit board 33, respectively, and the connectors CN1 and CN2 of the circuit board 33 are fitted to the connectors CN4 and CN3 of the circuit board 32, respectively. The connectors CN1 and CN2 of the circuit board 32 are fitted to the connectors CN5 and CN6 provided on the upper surface of the interface substrate 34, respectively, and the connectors CN7 and CN8 provided on the bottom surface of the interface substrate 34 are fitted to the connectors CN9 and CN10 provided on the upper surface of the interface substrate 35, respectively. All the connectors used in Fifth Embodiment are straight-type connectors as shown in FIG. 14C.

The BOST device 30F of Eighth Embodiment is especially suited when the circuit boards 31 to 33 can be stacked, and there is limitation in the dimension in the vertical direction.

Ninth Embodiment

Figure 15:
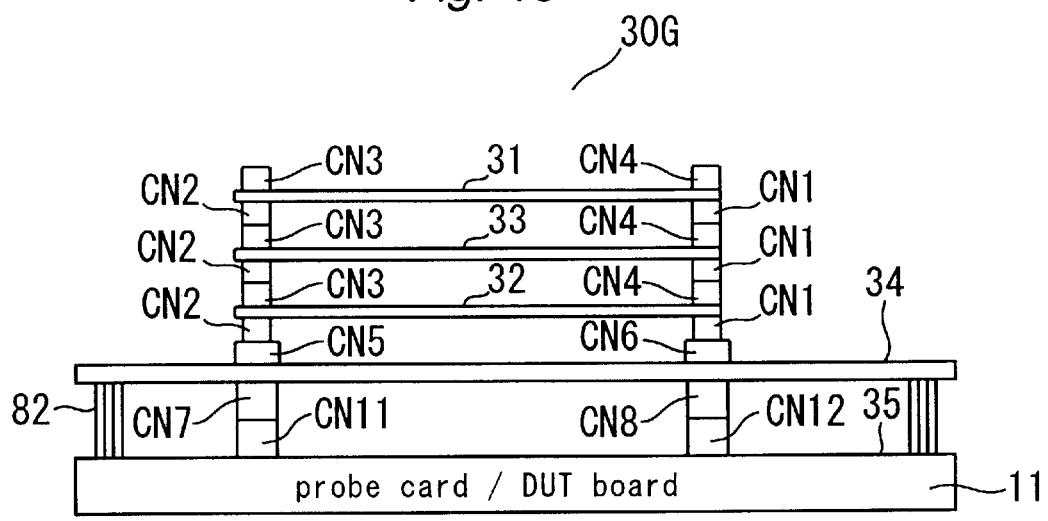
FIG. 15 is a side view of the substrate constitution of the BOST device 30G according to Ninth Embodiment

Ninth Embodiment is the use of a BOST device 30G in which the interface substrate 35 is removed from the BOST device 30F of Eighth Embodiment as in Embodiments 3 and 6. A side view of the substrate constitution of the BOST device 30G is shown in FIG. 15.

Since the interface substrate 35 is removed, the connectors CN7 and CN8 on the bottom surface of the interface substrate 34 are fitted to straight-type connectors CN11 and CN12 provided on the upper surface of the testing circuit board 11, respectively. The interface substrate 34 has an interconnection function between circuit boards 31, 32, and 33, as well as an interconnection function between the BOST device 30G and the testing circuit board 11, the testing head portion 25 connected thereto, and the test machine 20, and carries the relay circuit RY. In Ninth Embodiment, the BOST power source 71 carried by the interface substrate 35 in the previous embodiments is carried by the testing circuit board 11 or the circuit board 33.

Since the number of circuit boards can be reduced to four in Ninth Embodiment, a smaller BOST device 30G compared with Eighth Embodiment can be realized.

Tenth Embodiment

Figure 16:
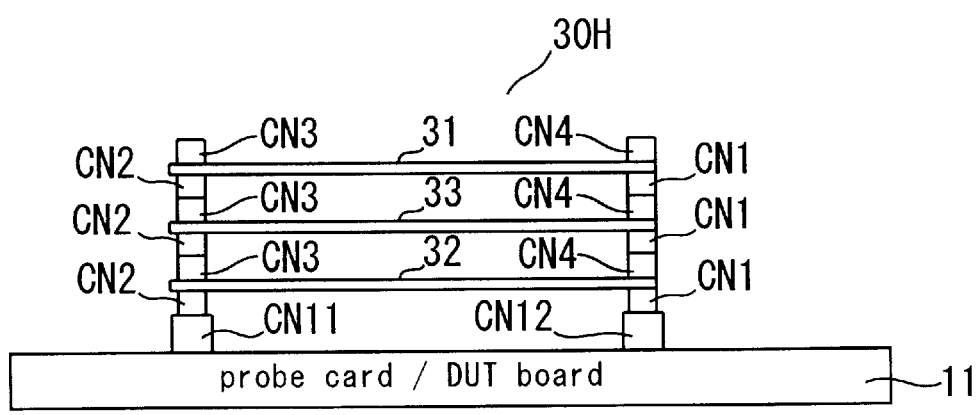
FIG. 16 is a side view of the substrate constitution of the BOST device 30H according to Tenth Embodiment

Tenth Embodiment is the use of a BOST device 30H in which the interface substrates 34 and 35 are removed from the BOST device 30F of Eighth Embodiment as in Fourth Embodiment and 7. A side view of the substrate constitution of the BOST device 30H is shown in FIG. 16. The BOST device 30H is also incorporated in testers shown in FIGS. 1 and 6.

Since the interface substrates 34 and 35 are removed, the connectors CN1 and CN2 on the bottom surface of the lowermost circuit board 32 are fitted to the connectors CN11 and CN12 provided on the upper surface of the testing circuit board 11, respectively. The testing circuit board 11 has an interconnection function between the BOST device 30H and the testing circuit board 11, the testing head portion 25 connected thereto, and the test machine 20. In Tenth Embodiment, the BOST power source 71 carried by the interface substrate 35 in the previous embodiments is carried by the testing circuit board 11 or the circuit board 33, and the relay circuit RY carried by the interface substrate 34 in the previous embodiments is carried by the testing circuit board 11 or the circuit board 31.

Since the number of circuit boards can be reduced to three in Tenth Embodiment, a smaller BOST device 30H compared with Eighth Embodiment can be realized.

Eleventh Embodiment

Eleventh Embodiment is a method for testing the A/D converter circuit 51 and the D/A converter circuit 52 of the DUT1, using the testers described in Embodiments 1 to 10, or the BOST devices 30 to 30H. According to this testing method, a mixed-signal-type DUT1 containing an A/D converter circuit and a D/A converter circuit can be tested at high accuracy and high speed. In addition, since the BOST device is constituted separately on a plurality of circuit boards, the space for testing is saved, and an efficient test can be conducted.

A tester of a semiconductor integrated circuit according to the present invention, as described above, since the test assisting device disposed in the vicinity of the testing circuit board is provided with a data circuit, a testing D/A converter circuit, a testing A/D converter circuit, a measured data memory, and a DSP analyzing portion; the test assisting device is made to conduct the A/D converter circuit and the D/A converter circuit of a semiconductor integrated circuit to be tested; and in addition, the test assisting device is constituted separately on a plurality of circuit boards; the test of a mixed-signal-type semiconductor integrated circuit comprising an A/D converter circuit and a D/A converter circuit can be conducted at high accuracy and high speed, and the cost reduction of the tester can be achieved, the test assisting device can be installed in a small space, and the space for testing is saved.

Also according to the tester using a first circuit board carrying at least a D/A converter circuit for testing and an A/D converter circuit for testing, a second circuit board carrying at least a measured data memory, and a third circuit board carrying at least a analyzing portion, the test at high accuracy and high speed can be conducted, and the price can be reduced. In addition, since the test assisting device is divided on at least three circuit boards, the test assisting device can be installed in a small space, and the space can be saved.

Also according to the tester in which the second circuit board carries a data circuit, or in which the first, second, and third circuit boards are disposed in parallel to each other and substantially perpendicularly to the testing circuit board, the size of the test assisting device can be reduced. According to the tester having an interface substrate or first and second interface substrates, the interface function can be performed securely. Furthermore, according to the tester in which at least a part of the first, second, and third circuit boards are disposed in the internal space of the scope hole, there is the effect to dispose the circuit board of the test assisting device effectively in the internal space of the scope hole.

Also according to the tester in which the testing circuit board is provided with a socket to mount the molded IC, the test of the molded semiconductor integrated circuit is easily conducted, and if the testing circuit board provided with probe needles is used, the test in a wafer can be easily conducted.

Also according to the tester in which the first, second, and third circuit boards are disposed in a line on a common plane substantially parallel to the testing circuit board, the height of the test assisting device can be reduced, and the test assisting device can be installed in a space where the height is limited. According to the tester in which interface substrates are combined, or the first and second interface substrates are combined, the interface function can be performed securely.

Also according to the tester in which the first, second, and third circuit boards are disposed in parallel to the testing circuit board so as to overlap each other with an interval, the height of the test assisting device can be reduced, and the test assisting device can be installed in a space where the height is limited. According to the tester in which interface substrates are combined, or the first and second interface substrates are combined, the interface function can be performed securely.

Also according to the tester in which a relay circuit is provided on the interface substrate, or the power source of the test assisting device is provided on the first interface substrate and a relay circuit is provided on the second interface substrate, the size of the test assisting device can be reduced.

According to the method for testing semiconductor integrated circuits of the present invention, since the test assisting device disposed in the vicinity of the testing circuit board is provided with a data circuit, a D/A converter circuit for testing, an A/D converter circuit for testing, a measured data memory, and a DSP analyzing portion; the test assisting device is made to conduct the A/D converter circuit and the D/A converter circuit of a semiconductor integrated circuit to be tested; and in addition, the test assisting device is constituted separately on a plurality of circuit boards; the test of a mixed-signal-type semiconductor integrated circuit comprising an A/D converter circuit and a D/A converter circuit can be conducted at high accuracy and high speed using a tester of a lower price; and by reducing the size of the test assisting device, the space for testing is saved, and an efficient test can be conducted.

According to the method for testing semiconductor integrated circuits using a first circuit board carrying at least the D/A converter circuit for testing and the A/D converter circuit for testing, a second circuit board carrying at least the measured data memory, and a third circuit board carrying the analyzer portion, the test can be conducted at high accuracy and high speed using a tester of a lower price; and since the test assisting device is divided on at least three circuit boards, the size of the test assisting device can be reduced, the space for testing is saved, and an efficient test can be conducted.

According to the method for testing semiconductor integrated circuits using the first, second, and third circuit boards are arranged in parallel to each other, and substantially perpendicularly to the testing circuit board, the width of the test assisting device can be reduced, the test assisting device can be installed in a space with a limited width, such as the scope hole of the testing head portion, and the test can be conducted while saving the space. According to the method for testing using a test assisting device in which interface substrates are combined, or a test assisting device in which the first and second interface substrates are combined, the test can be conducted while securing the interface function. Also, according to the method for testing using a tester in which at least a part of the first, second, and third circuit boards is disposed in the scope hole of the testing head portion, an efficient test can be conducted while effectively utilizing a limited space in the testing head portion.

According to the method using the testing circuit board furnished with the socket for mounting a molded IC, the test of the A/D converter circuit and the D/A converter circuit of a molded semiconductor integrated circuit can be conducted easily, and according to the method using the testing circuit board furnished with a plurality of probe needles, the test of a semiconductor integrated circuit in a wafer can be conducted.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-264641, filed on Aug. 31, 2001 including specification, claims, drawings and summary, on which the Convention priority of the present application is based, are incorporated herein by reference in its entirety.

What is claimed is:

1. A tester for semiconductor integrated circuits comprising a testing circuit board configured to transmit signals to and receive signals from a semiconductor integrated circuit to be tested that comprises an A/D converter circuit to convert analog signals to digital signals, and a D/A converter circuit to convert digital signals to analog signals; a test assisting device disposed in the vicinity of and connected to said testing circuit board; and a test machine connected to said test assisting device; said test assisting device having a data circuit to generate digital test signals and to supply the test signals to said D/A converter circuit of said semiconductor integrated circuit to be tested; a testing D/A converter circuit to convert digital test signals from said data circuit to analog test signals and to supply the test signals to said A/D converter circuit of said semiconductor integrated circuit to be tested; a testing A/D converter circuit to convert analog test outputs of said D/A converter circuit of said semiconductor integrated circuit to be tested to digital test outputs; a measured data memory to store the digital test outputs from said A/D converter circuit of said semiconductor integrated circuit to be tested and the digital test outputs of said testing A/D converter circuit; and an analyzer portion to analyze each of said digital test outputs stored in said measured data memory; these data circuit, testing D/A converter circuit, testing A/D converter circuit, measured data memory, and analyzer portion being constituted so as to be separately provided on a plurality of circuit boards; and said tester for semiconductor integrated circuits being constituted so as to supply the test signals containing said digital test signals and said analog test signals to said semiconductor integrated circuit to be tested based on instructions from said test machine, and to supply the results of analysis of each digital test output stored in said measured data memory by said analyzer portion to said test machine.

2. A tester for semiconductor integrated circuits comprising a testing circuit board constituted to transmit signals to and receive signals from a semiconductor integrated circuit to be tested that comprises an A/D converter circuit to convert analog signals to digital signals, and a D/A converter circuit to convert digital signals to analog signals; a test assisting device disposed in the vicinity of and connected to said testing circuit board; and a test machine connected to said test assisting device; said test assisting device having a data circuit to generate digital test signals and to supply the test signals to said D/A converter circuit of said semiconductor integrated circuit to be tested; a testing D/A converter circuit to convert digital test signals from said data circuit to analog test signals and to supply the test signals to said A/D converter circuit of said semiconductor integrated circuit to be tested; a testing A/D converter circuit to convert analog test outputs of said D/A converter circuit of said semiconductor integrated circuit to be tested to digital test outputs; a measured data memory to store the digital test outputs from said A/D converter circuit of said semiconductor integrated circuit to be tested and the digital test outputs of said testing A/D converter circuit; an analyzer portion to analyze each of said digital test outputs stored in said measured data memory; a first circuit board carrying at least said testing D/A converter circuit and said testing A/D converter circuit, a second circuit board carrying at least said measured data memory, and a third circuit board carrying said analyzer portion; and said tester for semiconductor integrated circuits being constituted so as to supply the test signals containing said digital test signals and said analog test signals to said semiconductor integrated circuit to be tested based on instructions from said test machine, and to supply the results of analysis of each digital test output stored in said measured data memory by said analyzer portion to said test machine.

3. The tester for semiconductor integrated circuits according to claim 2, wherein said second circuit board carries at least said measured data memory together with said data circuit.

4. The tester for semiconductor integrated circuits according to claim 2, wherein said first circuit board, second circuit board, and third circuit board are disposed so as to be substantially parallel to each other, and to be substantially perpendicular to said testing circuit board.

5. The tester for semiconductor integrated circuits according to claim 4, wherein an interface substrate is disposed in substantially parallel to said testing circuit board, and said interface substrate is adopted to transmit and receive signals between said first, second, and third substrates, and also to transmit signals to and receive signals from said testing circuit board.

6. The tester for semiconductor integrated circuits according to claim 4, wherein a first interface substrate and a second interface substrate are disposed in substantially parallel to said testing circuit board, said first interface substrate is adopted to transmit and receive signals between said first, second, and third circuit boards, and said second interface substrate is adopted to transmit signals to and receive signals from said testing circuit board.

7. The tester for semiconductor integrated circuits according to claim 2, wherein a testing head portion of said test machine is disposed in the vicinity of said testing circuit board, said testing head portion has a scope hole passing therethrough, and at least a part of said first, second, and third circuit boards is positioned in said scope hole.

8. The tester for semiconductor integrated circuits according to claim 7, wherein said semiconductor integrated circuit is constituted so as to cover the semiconductor integrated circuit chip with a molding resin, and as a molded IC in which a plurality of terminals are drawn out of said molding resin; and said testing circuit board has a socket for attaching said molded IC.

9. The tester for semiconductor integrated circuits according to claim 7, wherein said semiconductor integrated circuit is contained in a semiconductor wafer, and a plurality of probe needles contacting said semiconductor integrated circuit are provided on said testing circuit board.

10. The tester for semiconductor integrated circuits according to claim 2, wherein said first, second, and third circuit boards are arranged in a line on the common plane substantially parallel to said testing circuit board.

11. The tester for semiconductor integrated circuits according to claim 10, wherein an interface substrate is disposed substantially parallel to said testing circuit board, and said interface substrate is adopted to transmit and receive signals between said first, second, and third circuit boards, and to transmit signals to and receive signals from said testing circuit board.

12. The tester for semiconductor integrated circuits according to claim 10, wherein a first interface substrate and a second interface substrate are disposed substantially parallel to said testing circuit board, said first interface substrate is adopted to transmit and receive signals between said first, second, and third circuit boards, and said second interface substrate is adopted to transmit signals to and receive signals from said testing circuit board.

13. The tester for semiconductor integrated circuits according to claim 2, wherein said first, second, and third circuit boards are disposed in substantially parallel to said testing circuit board, so as to overlap each other via gaps therebetween.

14. The tester for semiconductor integrated circuits according to claim 13, wherein an interface substrate is disposed substantially parallel to said testing circuit board, and said interface substrate is adopted to transmit and receive signals between said first, second, and third circuit boards, and to transmit signals to and receive signals from said testing circuit board.

15. The tester for semiconductor integrated circuits according to claim 13, wherein a first interface substrate and a second interface substrate are disposed substantially parallel to said testing circuit board, said first interface substrate is adopted to transmit and receive signals between said first, second, and third circuit boards, and said second interface substrate is adopted to transmit signals to and receive signals from said testing circuit board.

16. The tester for semiconductor integrated circuits according to claim 5, wherein said interface substrate carries a relay circuit that switches test signals from said test machine to said semiconductor integrated circuit to be tested, and test signals from said test assisting device to said semiconductor integrated circuit to be tested.

17. The tester for semiconductor integrated circuits according to claim 6, wherein said first interface substrate carries the power source of said test assisting device; and said second interface substrate carries a relay circuit that switches test signals from said test machine to said semiconductor integrated circuit to be tested, and test signals from said test assisting device to said semiconductor integrated circuit to be tested.

\* \* \* \* \*